(12) United States Patent
Johnson et al.

(10) Patent No.: US 11,127,482 B1
(45) Date of Patent: Sep. 21, 2021

(54) DETECTION CIRCUITRY TO DETECT A DECK OF A MEMORY ARRAY

(71) Applicant: Micron Technology, Inc., Boise, ID (US)

(72) Inventors: Bret Addison Johnson, Folsom, CA (US); Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/847,181

(22) Filed: Apr. 13, 2020

(51) Int. Cl.
| | | |
|---|---|---|
| *G11C 29/54* | (2006.01) | |
| *G11C 29/00* | (2006.01) | |
| *G11C 29/12* | (2006.01) | |
| *G11C 29/14* | (2006.01) | |
| *G11C 29/36* | (2006.01) | |
| *G11C 29/04* | (2006.01) | |

(52) U.S. Cl.
CPC ...... *G11C 29/789* (2013.01); *G11C 29/12005* (2013.01); *G11C 29/14* (2013.01); *G11C 29/36* (2013.01); *G11C 2029/0407* (2013.01); *G11C 2029/1202* (2013.01); *G11C 2029/1204* (2013.01)

(58) Field of Classification Search
None
See application file for complete search history.

(56) References Cited

U.S. PATENT DOCUMENTS

2011/0148469 A1* 6/2011 Ito .................... H03K 5/153
327/77

* cited by examiner

*Primary Examiner* — James G Norman
(74) *Attorney, Agent, or Firm* — Fletcher Yoder, P.C.

(57) ABSTRACT

As described, a device may include detection circuitry to detect a deck of a memory array. The deck may include a conductive identifier coupled between a logic high voltage node and the detection circuitry a control circuit coupled to the detection circuit. The control circuit may perform operations including transmitting a test enable signal to the detection circuitry. The detection circuitry may generate a valid signal indicative of an existence of the conductive identifier of the deck in response to the test enable signal. The operations may also include the control circuit receiving the valid signal from the detection circuitry and adjusting a memory operation associated with the memory array based at least in part on the valid signal.

20 Claims, 9 Drawing Sheets

DETECTION CIRCUITRY TO DETECT A DECK OF A MEMORY ARRAY

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through decoding circuitry (e.g., decoders). The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. A maximum address (e.g., upper limit of an address) may be based on how many memory cells are formed in a single deck and how many decks a memory array includes. When manufacturing memory devices, a variety of memory arrays with different numbers of decks may be produced in a same production line. Since the number of decks of a respective memory array is used to determine the maximum address of the memory device, an approach that improves determination of the number of desks (e.g., improves a consistency of determination) may be desired.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more decoder circuits may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array. The number of decks may change a total memory capacity of the array. Since the total number of decks change how many memory cells are included in the array, a maximum address of the array may be based, at least partially, on the total number of decks of the array. Thus, memory operations and addressing used in the memory operations may change based on the number of decks.

In some cases, a number of decks may be identified at a time of manufacturing. The number of decks may be memorialized in registers and/or in fuses of a memory device, such that a memory controller may determine the number of decks during operation of the memory device. Identifying the number of decks may be performed at a time of manufacturing by counting the decks and/or tracking manufacturing operations to form the memory device. However, this method of identifying the number of decks may be susceptible to human and/or manufacturing error since a number of layers may be misidentified and unable to be corrected in the registers and/or fuses used to store an indication of the number of layers. Furthermore, even if a correct number of decks are identified, the number of decks may be mis-entered into the register and/or into the fuses.

One way to detect a mis-entered number of decks may be to identify when nonsense data and/or incorrect data is read from the memory array. However, during operation, it may be relatively difficult to identify when the memory device is mis-operating (e.g., operating according to an undesired operation) or when the memory device is addressing to memory cells that do not exist, such as may occur when a number of decks is incorrect and used by the memory controller during memory operations since incorrect data is merely output as incorrect data without indication of a root cause of the incorrect data.

In some cases, however, at least a subset of the decks (e.g., each deck) may include connections (e.g., deck-specific conductive identifiers) that enable identification of a number of layers within the array. In this way, a memory controller may determine a number of decks without use of the above-discussed deck determination memorialized in registers and/or fuses. The deck-specific conductive identifiers may each be a metal element associated with a deck (e.g., integrated into the deck, associated with a coupling of the deck). The memory controller may detect each deck-specific conductive identifier to determine the number of layers of decks within the array. Using hardwired connections to detect that a deck includes a closed circuit connection may improve operation of the memory device by reducing a likelihood that an incorrect number of decks is used to generate memory addresses.

The memory controller may repeat identification of the number of decks at each power-on of the memory device. However, in some cases, the number of decks may be stored in a feedback path such that repeating identification of the number of decks is relatively more complicated to perform. For example, repeat identifications of a number of decks may be performed in response to detection circuitry receiving multiple operationally enabling signals as opposed to a single signal transmitted in response to power-on of the memory device. Using at least these described systems and methods, the memory controller may determine the addresses of the memory array using a subset of the decks (e.g., deck 0, deck 1, deck 2, without using deck 3).

Figure 1:
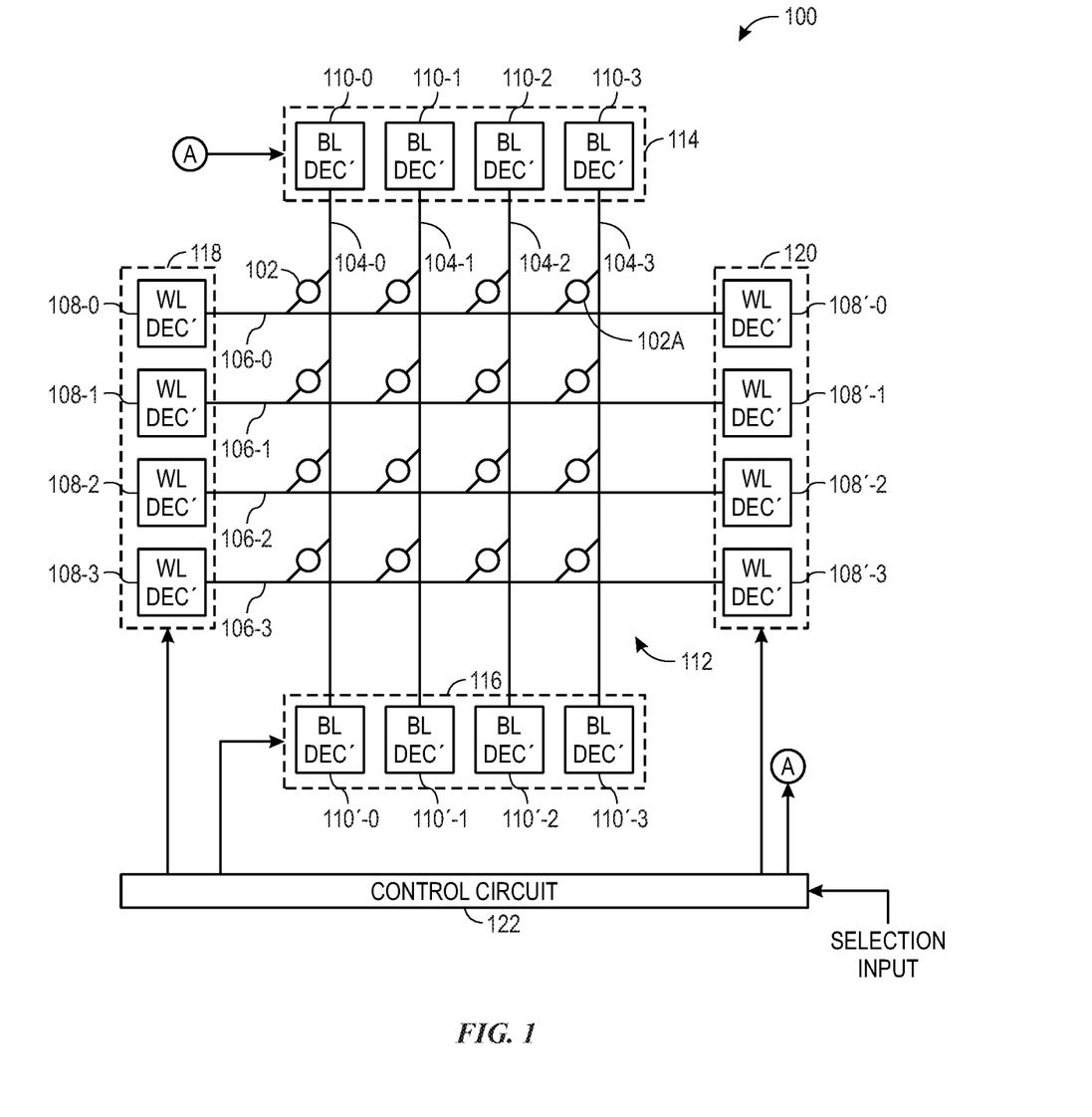
FIG. 1 is a simplified block diagram illustrating certain features of a memory device, according to an embodiment of the present disclosure.

Keeping the foregoing introduction in mind, FIG. 1 is a block diagram of a portion of a memory 100. The memory 100 may be any suitable form of memory, such as non-volatile memory (e.g., a cross-point memory) and/or volatile memory. The memory 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell.

The bitline decoders 110 may be organized in multiple groups of decoders. For example, the memory 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage, or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity to the memory cells 102 (e.g., in particular, writing to selector device (SD) material of the memory cell) and reading the memory cells 102 (e.g., in particular, reading a voltage stored by the SD material of the memory cell) using a signal with a given (e.g., known) fixed polarity.

Figure 2:
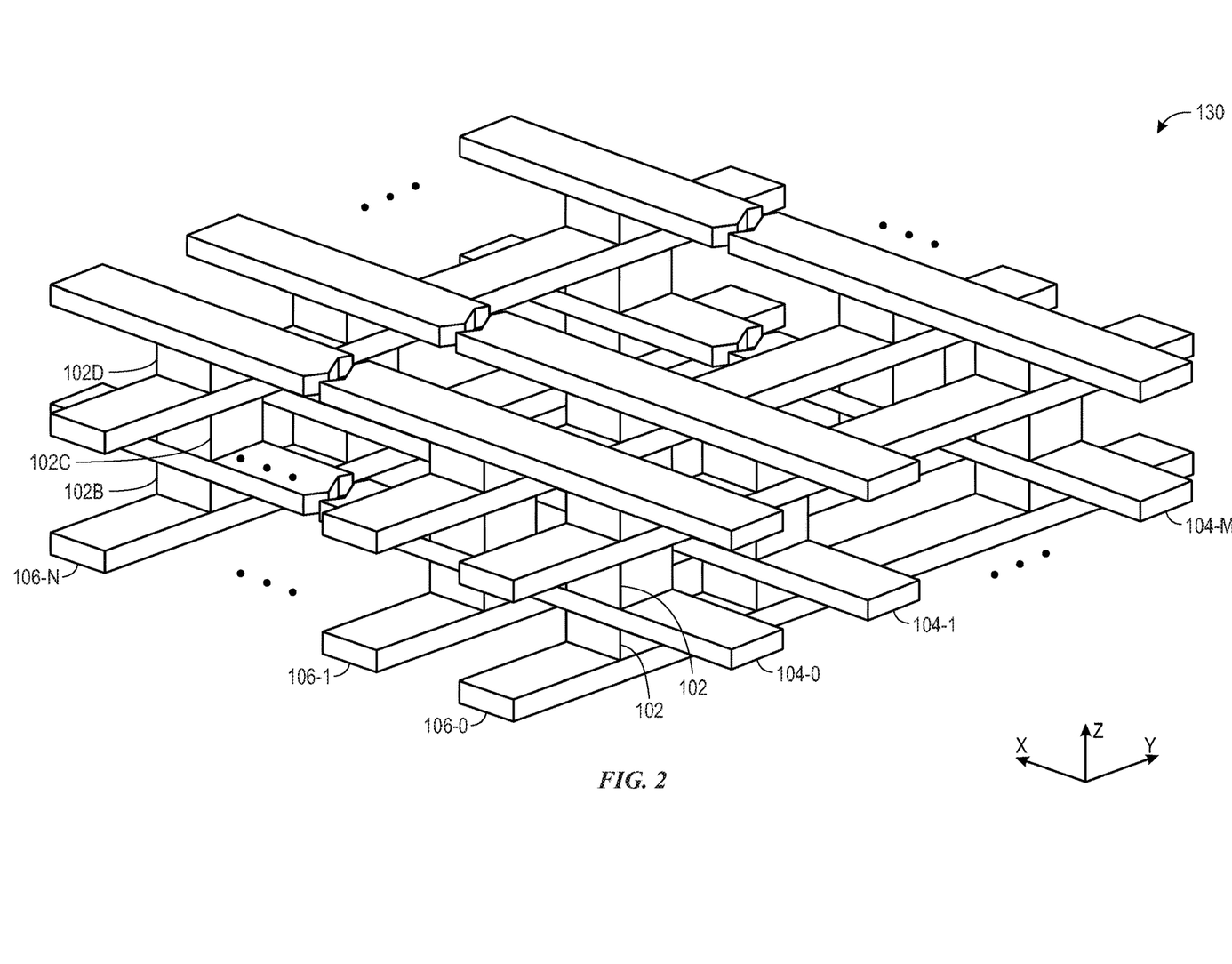
FIG. 2 is a circuit diagram illustrating a memory array of FIG. 1, according to an embodiment of the present disclosure.

FIG. 2 is a diagram illustrating a portion of a memory array 130 in accordance with an embodiment of the present disclosure. The memory array 130 may be a cross-point array including wordlines 106 (e.g., 106-0, 106-1, ..., 106-N) and bitlines 104 (e.g., 104-0, 104-1, ..., 104-M). A memory cell 102 may be located at each of the intersections of the wordlines 106 and bitlines 104. The memory cells 102 may function in a two-terminal architecture (e.g., with a particular of the wordlines 106 and the bitlines 104 serving as the electrodes for a particular of the memory cells 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or less bitlines 104, wordlines 106, and/or memory cells 102 than shown in the examples of FIG. 2. Each deck may include one or more memory cells 102 aligned in a same plane.

Figure 3:
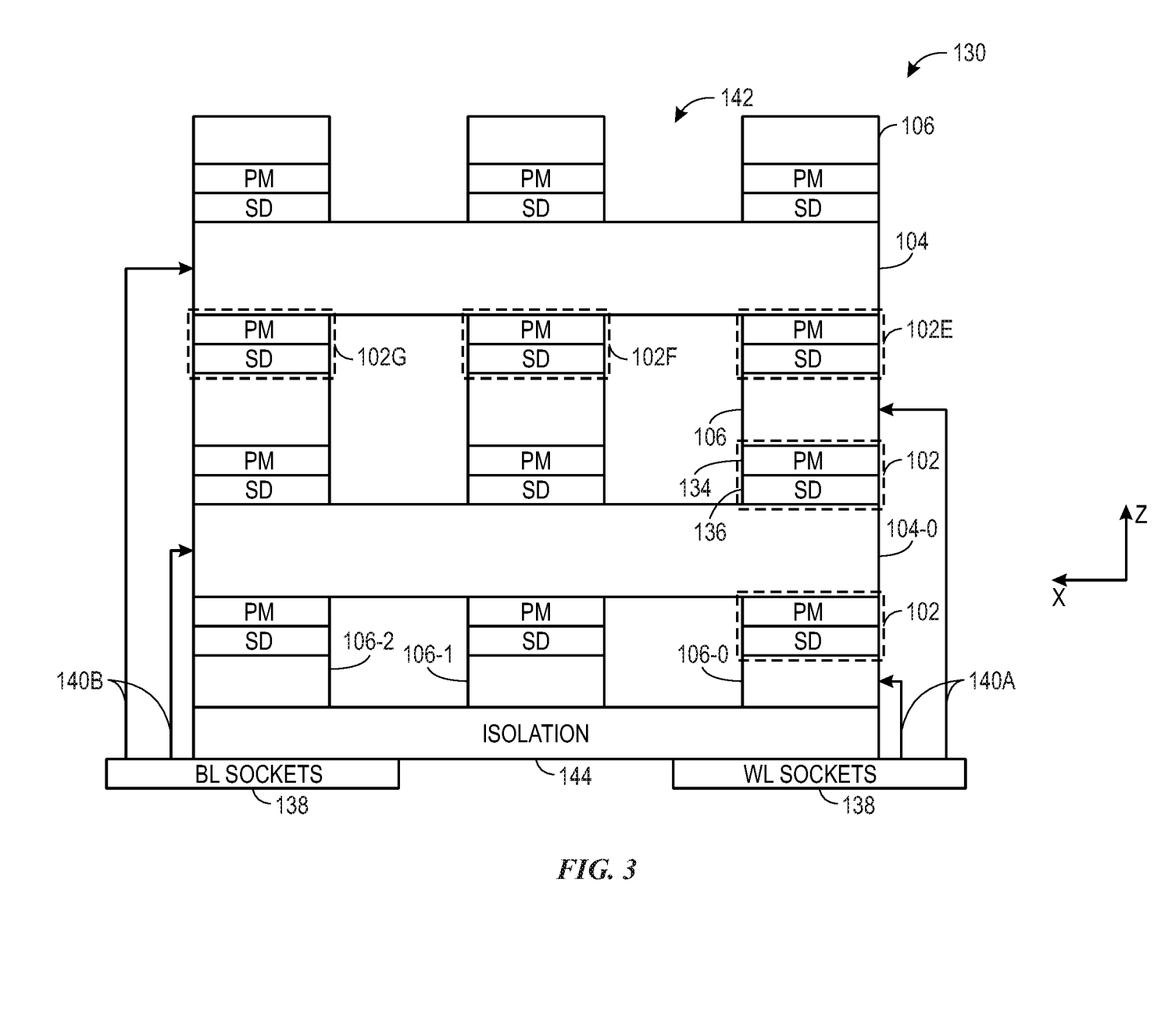
FIG. 3 is a side-view of a diagram illustrating the portion of the memory array of FIG. 2, according to an embodiment of the present disclosure.

FIG. 3 is a side-view of a diagram illustrating the portion of the memory array 130 of FIG. 2. In particular, the memory array 130 of FIG. 3 includes the wordlines 106, the bitlines 104, and the memory cells 102 discussed earlier. Each of the memory cells 102 may be disposed in a particular plane between a bitline and a wordline. The levels of planes may be referred to as "decks," and thus the depicted example includes the memory cells 102E, 102F, and 102G disposed in a same deck and includes four decks of memory cells 102 in total. Each of the memory cells 102 may include phase-change material (PM) 134 and selector device material (SD) 136. It is noted that in some memory arrays 130, the PM 134 and the SD 136 may be combined or functionally provided by one material layer, as opposed to two material layers. In this way, some memory arrays 130 may be based on single channel (e.g., SD-only) process architectures that reduce cross-contaminations between PM 134 and SD 136 layers.

The memory array 130 also may include sockets 138. Each socket 138 may include decoders coupled to each of the bitlines 104 and/or wordlines 106. The sockets 138 may be used when transmitting signals read from and/or written to (e.g., signals 140A, signals 140B) the memory cells 102 from other circuitry of the memory 100. It is noted that the arrows corresponding to the signals 140A and/or the signals 140B may generally represent communication between the wordlines 106 and/or the bitlines 104 and the decoders of the sockets 140. It is noted that negative space 142 depicted between the wordlines 106 and/or the bitlines 104 (and other circuitries of the memory array 130) may correspond to air or ambient atmosphere of the memory 100, however the negative space 142 may also be filled with insulating material and/or other suitable material for use in a computing device. It is noted that distances between the wordlines 106 and/or the bitlines 104 may be exaggerated for clarity and may be reduced in an actual implementation to reduce a volume of negative space 142 within the final manufactured product. It is also noted that an additional isolation material layer 144 may be disposed above the sockets 138 (e.g., between socket 138 layer and a first deck of wordlines 106 or bitlines 104).

Respective ones of the memory cells 102 may be accessed based on a memory address that defines at which intersection of wordlines 106 and bitlines 104, and on what deck, the respective one of the memory cells 102 is formed. Since a total number of decks change how many memory cells 102 are included in the memory array 130, a maximum memory address of the memory array 130 may be based on the total number of decks. Thus, memory operations and ranges used for memory addressing used in the memory operations may change based on the number of decks.

In some cases, a number of decks may be identified at a time of manufacturing. In these cases, the number of decks may be memorialized in one-time writable registers and/or in fuses, such that the control circuit 122, or other suitable memory controller, may determine the number of decks for reference during operation and/or for reference when determining memory addresses. Identifying the number of decks may be done by physically counting the decks approximately at a time of manufacturing and/or by tracking manufacturing operations performed when forming the memory array 130. This method of identifying the number of decks, however, may be susceptible to human and/or manufacturing error since a number of layers may be misidentified and unable to be corrected in one-time writable registers and/or fuses.

To improve operations used to identify a number of decks in the memory array 130, conductive identifiers may be associated with one or more decks of the memory array 130. The control circuit 122 may test a connection associated with the conductive identifier as a way to test whether a deck exists or is absent from the memory array 130. The conductive identifier may be included on each deck of the memory array 130 and/or on a subset of decks of the memory array 130. When using a subset of decks of the memory array 130 to identify the number of decks in the memory array, a first output from a detection circuit may correspond to a first number of decks (e.g., 4 decks), a second output from the detection circuit may correspond to a second number of decks (e.g., 2 decks), and a lack of output (e.g., no output, logic low output) may correspond to a third number of decks (e.g., 1 deck). As described herein, various combinations of logic gate circuitry may be coupled together to detect the number of decks. It should be understood that the logic gates discussed herein may be suitably replaced with equivalent combinations of logic gates, such as any suitable combination of one or more AND gates, OR gates, not-AND gates, not-OR gates, exclusive-OR gates, inverting gates, flip-flops (of any variety), or the like.

Figure 4:
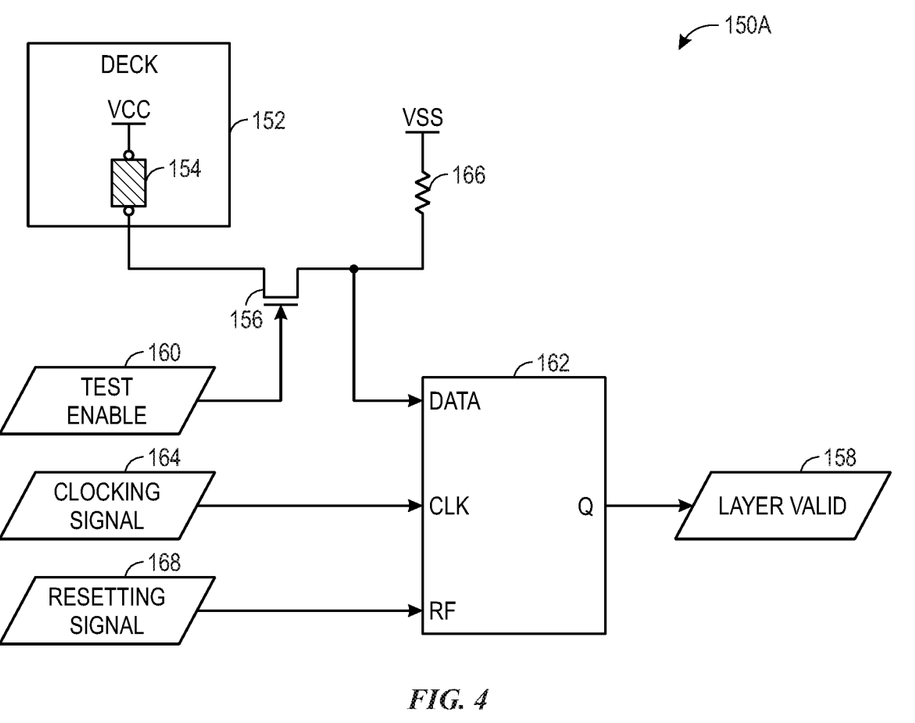
FIG. 4 is a circuit diagram of a detection circuit used to detect a deck of the memory array of FIG. 2, according to an embodiment of the present disclosure.

To elaborate, FIG. 4 is a circuit diagram of a detection circuit 150A used to detect a deck 152. The deck 152 may include a conductive identifier 154 coupled between a switch 156 and a system high voltage supply, VCC, (e.g., voltage node, node, logic high voltage node). During manufacturing of the memory array 130, the conductive identifier 154 may be disposed in a physical area of a memory core of the memory array 130 and/or in a periphery circuit area of the memory array 130. Each deck 152 may be formed by a series of material layer forming operations and patterning operations. When the deck 152 does not exist, the layers of the deck 152 does not exist, and thus may not include the conductive identifier 154. Since the conductive identifier 154 uses one of the deck 152 layers, the connection will not exist (e.g., be an open circuit) when the deck 152 does not exist and when the deck 152 exists, the conductive identifier 154 exists, even if physically disposed outside the memory core of the memory array 130 (e.g., within memory array 112). It is noted that the conductive identifier 154 may additionally or alternatively couple to a voltage supply (e.g., a voltage node), where a different voltage supply is used as a system voltage supply. The detection circuit 150A may be disposed within the control circuit 122, another suitable controller, outside of the deck 152 (as depicted), on the deck 152, or any combination thereof. The control circuit 122 may identify whether the deck 152 exists based on generation of a Layer Valid signal 158.

To identify whether the deck 152 exists, the control circuit 122 may transmit a control signal, Test Enable signal 160. The Test Enable signal 160 may include a voltage and/or current of sufficient amplitude to activate the switch 156. When the conductive identifier 154 is included on the deck 152, a transmission path between a flip-flop 162 and the system high voltage supply is completed. This causes the input received at a DATA terminal of the flip-flop 162 to be a logic high signal.

While the input at the DATA terminal of the flip-flop 162 is a logic high signal, the control circuit 122 may generate a Clocking signal 164 (e.g., a signal received at the clock (CLK) terminal of the flip-flop 162 that operates the flip-flop 162 to lock in and/or clock the input at the DATA terminal or other suitable terminal). When clocked, the output of the flip-flop 162 changes to be a logic high signal and the control circuit 122 reads the Layer Valid signal 158 as a logic high signal. It is noted that the Clocking signal 164 is not necessarily a clock signal and may thus be any suitable signal able to operate the flip-flop 162 to change its output.

If the deck 152 were to not be included in the memory array 130 but the control circuit 122 were to attempt identification of the deck 152, the transmission path between the flip-flop 162 and the system high voltage supply may not be present and just a transmission path between the flip-flop 162 and a system low voltage supply, VSS (e.g., ground voltage, logic low reference voltage) may be closed. The transmission path may include and/or be characterized by a resistance 166. This arrangement may cause the input received at the DATA terminal of the flip-flop 162 to be a logic low signal. When the logic low signal is received at a DATA terminal of the flip-flop 162 and when the Clocking signal 164 causes the clocking of the logic low signal, the output of the flip-flop 162 may change to be a logic low signal, read by the control circuit 122 as indicating the lack of a presence of the deck 152.

In some cases, the control circuit 122 may determine to reset an output from the flip-flop 162. To do so, the control circuit 122 may generate and transmit a Resetting signal 168 to the flip-flop 162 (e.g., at an Rf terminal). In this depicted case, the Resetting signal 168 may be transmitted as having a logic low value since the Rf terminal of the flip-flop 162 may activate at logic low (e.g., "f" indicator of "Rf" terminal label indicates logic low activation for the pin). However, it should be noted that for cases where a flip-flop receives a Resetting signal 168 at a non-inverse pin, the Resetting signal 168 may have a logic high value to reset the output from the flip-flop.

Each deck 152 of the memory array 130 may include a respective conductive identifier 154. In this way, the memory array 130 may include one or more conductive identifiers, one for each deck 152. That is, where a conductive identifier 154 does not exist, a deck 152 may be said to not exist. And thus, it may be said that the control circuit 122 is generally detecting how many respective conductive identifiers the memory array 130 includes to determine a total number of decks of the memory array.

The control circuit 122 may receive one or more respective Layer Valid signals (e.g., a respective one of which is the Layer Valid signal 158). A bit (e.g., logic high bit or "1", logic low bit or "0") corresponding to a value of the Layer Valid signal 158 and any other Layer Valid signals, or other state identifying information, may be stored in one or more registers or other suitable data stores. The control circuit 122 may interpret information stored in the registers as indicative of a presence or existence the deck 152 or additional decks. In some cases, the control circuit 122 may directly receive the Layer Valid signal 158 and any other Layer Valid signals for use in control operations.

Figure 5:
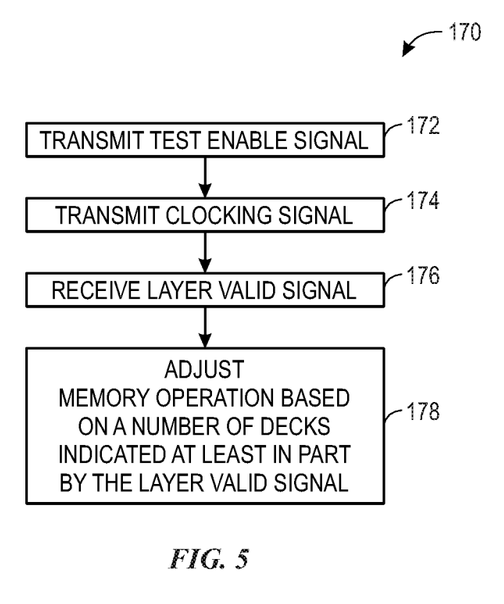
FIG. 5 is a flowchart of a process for operating the detection circuit to detect the deck of FIG. 4, according to an embodiment of the present disclosure.

To help elaborate on the operation of the control circuit 122, FIG. 5 is a flowchart of a process 170 for detecting the deck 152. The control circuit 122 is described below as performing the process 170, but it should be understood that any suitable processing circuit may additionally or alternatively perform the process 170. Furthermore, although the process 170 is described below as being performed in a particular order, it should be understood that another suitable order may be used to perform individual operations of the process 170.

At block 172, the control circuit 122 may transmit the Test Enable signal 160. The control circuit 122 may transmit the Test Enable signal 160 in response to the memory array 130 being powered-on, such as in response to a memory device and/or electronic device as a whole being powered-on. In some cases, the Test Enable signal 160 is a signal derived from a power signal, such that at power-on the Test Enable signal 160 is automatically transmitted to the detection circuit 150A. In this way, the control circuit 122 may generate and transmit the Test Enable signal 160 in response to a powering-on of at least the detection circuitry 150A.

At block 174, the control circuit 122 may transmit the Clocking signal 164. As discussed, the Clocking signal 164 may operate the flip-flop 162 to latch and/or store an input received at its DATA terminal. The control circuit 122 may wait a duration of time after the transmission of the Test Enable signal 160 to permit the input at the DATA terminal to suitably indicate the presence of the deck 152. The Clocking signal 164 may be a single pulse designed to operate the flip-flop 162 to lock one value associated with the conductive identifier 154. As discussed, when the conductive identifier 154 is included on the deck 152, a transmission path between the flip-flop 162 and the system high voltage supply is completed. This may cause the input received at a DATA terminal of the flip-flop 162 to be a logic high signal ready to be stored in the flip-flop 162 at a transition of the Clocking signal 164.

After clocking and/or latching the input of the DATA terminal into the flip-flop 162, at block 176, the control circuit 122 may receive the Layer Valid signal 158 from the detection circuit 150A. It is noted that when multiple decks (e.g., decks additional to the deck 152) are being detecting, the control circuit 122 may receive a number of valid signals (e.g., additional signals similar to the Layer Valid signal 158) corresponding to each of decks. The control circuit 122 may determine a number of decks using the Layer Valid signal 158 from the detection circuit 150A and any additional valid signals.

At block 178, the control circuit 122 may adjust a memory operation and/or one or more of its control operations based at least in part on the number of decks determined using the Layer Valid signal 158. For example, the control circuit 122 may mask additional addresses referencing decks that are not present in the memory array 130 such that memory operations do not involve non-existing decks. As a second example, the control circuit 122 may change an indication of a maximum address value used in a memory operation (e.g., parameters referenced when generating a read command, a write command, a refresh command, or the like). In some cases, the Layer Valid signal 158 may transmit directly to circuitry that uses information associated with the number of decks in its operation.

FIG. 4 and FIG. 5 may describe how the control circuit 122 may generally operate to detect the deck 152. It is noted that other variations to the detection circuit 150A may also permit the control circuit 122 to detect the deck 152. These other variations may adjust what signal is received at the DATA terminal, a clock (CLK) terminal of the flip-flop 162, the Rf terminal of the flip-flop 162, and/or what circuitry adjusts signals transmitted within various detection circuits 150. It is noted that some features described with reference to the detection circuit 150 may be suitably applied to one or more of the detection circuit 150 examples. For example, descriptions of the detection circuit 150A may also apply to the detection circuit 150B and/or any other detection circuit described herein.

Figure 6:
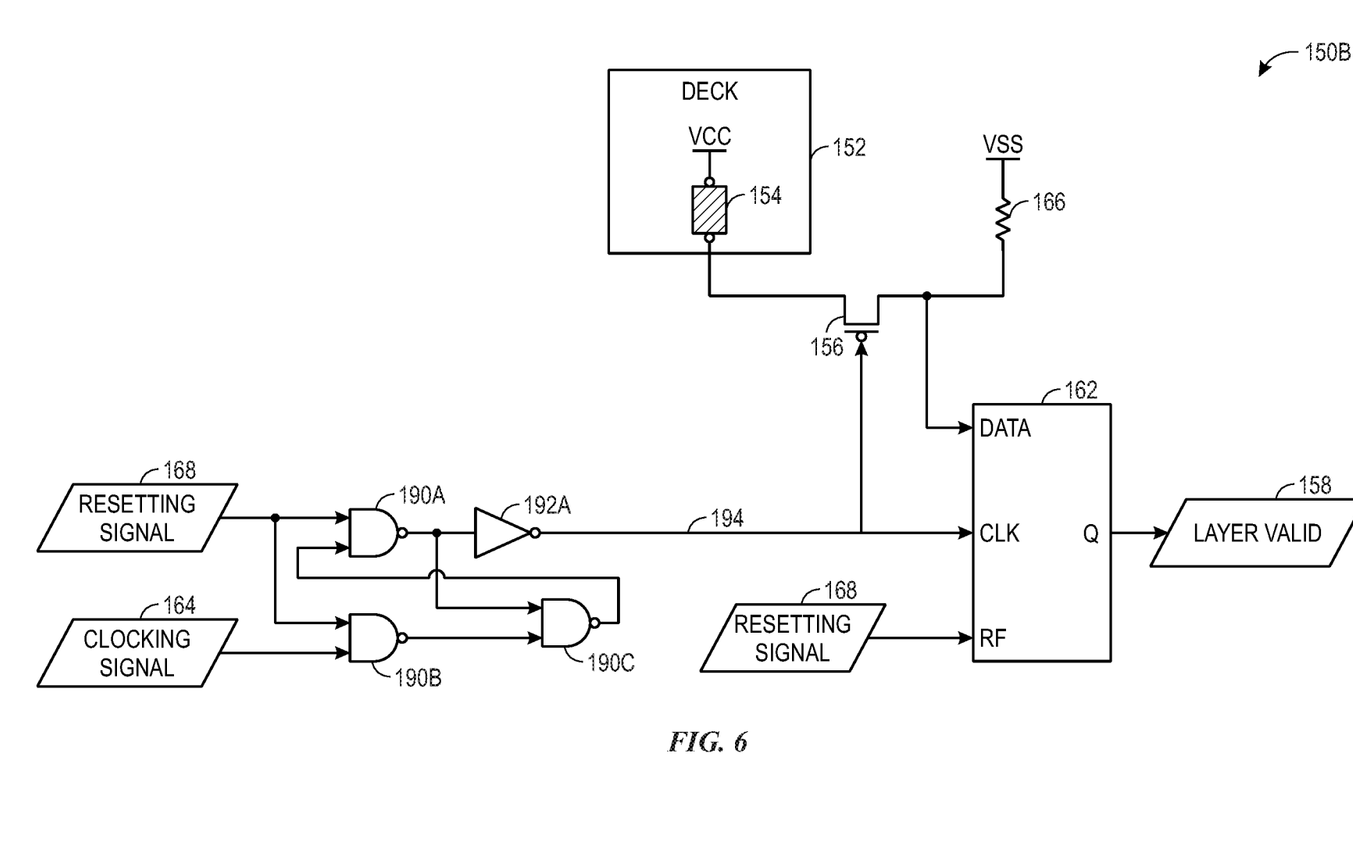
FIG. 6 is a circuit diagram of a second detection circuit used to detect a deck of the memory array of FIG. 2, according to an embodiment of the present disclosure.

To elaborate, FIG. 6 is a circuit diagram of a detection circuit 150B used to detect the deck 152. The detection circuit 150B includes additional circuitry relative to the detection circuit 150A of FIG. 4, and thus may operate to prevent multiple re-samplings of the conductive identifier 154 by blocking a path to the CLK input of the flip-flop 162 (e.g., storage element represented by flip-flop 162). This may be desired when transmission of the Clocking signal 164 may be repeated during operation of the memory 100. The deck 152 includes the conductive identifier 154 coupled between the switch 156 and the system high voltage supply, VCC. The detection circuit 150B may be disposed within the control circuit 122, another suitable controller, outside of the deck 152 (as depicted), on the deck 152, or any combination thereof. The control circuit 122 may identify that the deck 152 exists by reading the Layer Valid signal 158.

The control circuit 122 may initially test that the deck 152 exists by transmitting the Resetting signal 168 via logic gates 190 (190A, 190B, 190C). When the control circuit 122 also transmits the Clocking signal 164 to the logic gates 190, the logic gate 190A may output a logic low signal to an inverting gate 192A to generate a control signal 194. The control signal 194 may activate the switch 156.

The control signal 194 may include a voltage and/or current of sufficient value to activate the switch 156. When the conductive identifier 154 is included on the deck 152, a transmission path between a flip-flop 162 and the system high voltage supply is completed. This causes the input received at a DATA terminal of the flip-flop 162 to be a logic high signal.

The control signal 194 may also cause the flip-flop 162 to store the logic high signal received at the DATA terminal. The flip-flop 162 storing the logic high signal value may cause the Layer Valid signal 158 to output to the control circuit 122, thereby indicating the existence of the deck 152. It is noted that, to reset the output from the flip-flop 162, such as to repeat performance of the detection, the control circuit 122 may transmit the Resetting signal 168 to the flip-flop 162 (e.g., at an Rf terminal).

Figure 7:
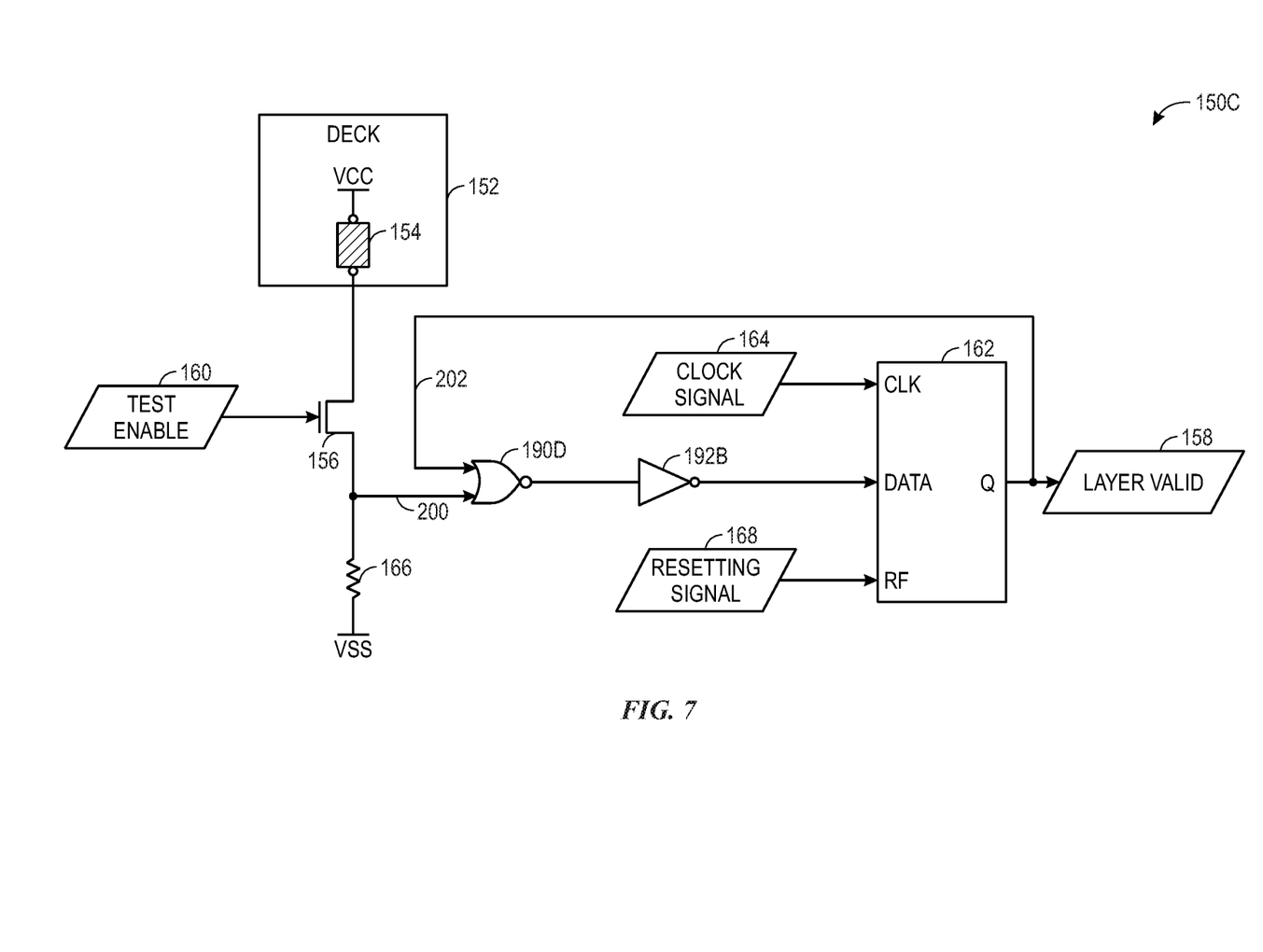
FIG. 7 is a circuit diagram of a third detection circuit used to detect a deck of the memory array of FIG. 2, according to an embodiment of the present disclosure.

As another example, FIG. 7 is a circuit diagram of a detection circuit 150C used to detect the deck 152. The detection circuit 150C includes additional circuitry relative to the detection circuit 150A of FIG. 4, and thus may operate to prevent multiple re-samplings of the conductive identifier 154 by blocking a path to the DATA input of the flip-flop 162 (e.g., storage element represented by flip-flop 162), which may be desired after the Test Enable signal 160 is deactivated. This may be desired when transmission of the Clocking signal 164 may be repeated during operation of the memory 100. The deck 152 includes the conductive identifier 154 coupled between the switch 156 and the system high voltage supply, VCC. The detection circuit 150C may be disposed within the control circuit 122, another suitable controller, outside of the deck 152 (as depicted), on the deck 152, or any combination thereof. The control circuit 122 may identify that the deck 152 exists by reading the Layer Valid signal 158.

The control circuit 122 may initially test that the deck 152 exists by transmitting the Test Enable signal 160 directly to the switch 156. When the deck 152 exists, a logic high signal transmits to logic gate 190D. When the control circuit 122 is performing the detection operation for a first time, the logic gate 190D may receive a logic high signal via a path 200 and a logic low signal via a path 202. In response to these inputs on the paths 200 and 202, the logic gate 190D may output a logic low signal to inverter 192B, which generates a logic high signal for transmission to the DATA terminal of the flip-flop 162. When the control circuit 122 transmits the Clocking signal 164 to the flip-flop 162, the flip-flop 162 may generate the Layer Valid signal 158 that includes the logic high signal. The control circuit 122 may receive the Layer Valid signal 158 and use the value of the Layer Valid signal 158 to determine how many decks are in the memory array 130.

The detection circuit 150C may also include a feedback path (e.g., path 202). The path 202 may feedback the value of the Layer Valid signal 158 to the logic gate 190D. This feedback path helps the detection circuit 150C to "memorize" or store the presence of the deck 152. Thus, the logic gate 190D may continue to generate a logic low signal output using the memorized initial output of the Layer Valid signal 158, even if the flip-flop 162 receives a logic high signal as the Clocking signal 164 at the CLK terminal and/or a logic low signal as the Resetting signal 168 at the Rf terminal. To reset the output of the flip-flop 162, the control circuit 122 may receive a logic high signal as the Clocking signal 164 at the CLK terminal and a logic low signal as the Resetting signal 168 at the Rf terminal, to be subsequently followed by a logic high signal as the Test Enable signal 160 to repeat activation of the switch 156. Reducing a likelihood of multi-detection operations by preserving initial detection results (e.g., the first change in state of the Layer Valid signal 158 to indicate existence of the deck 152) may improve operation of the memory device by reducing power consumed by the memory device to identify the deck 152.

Figure 8:
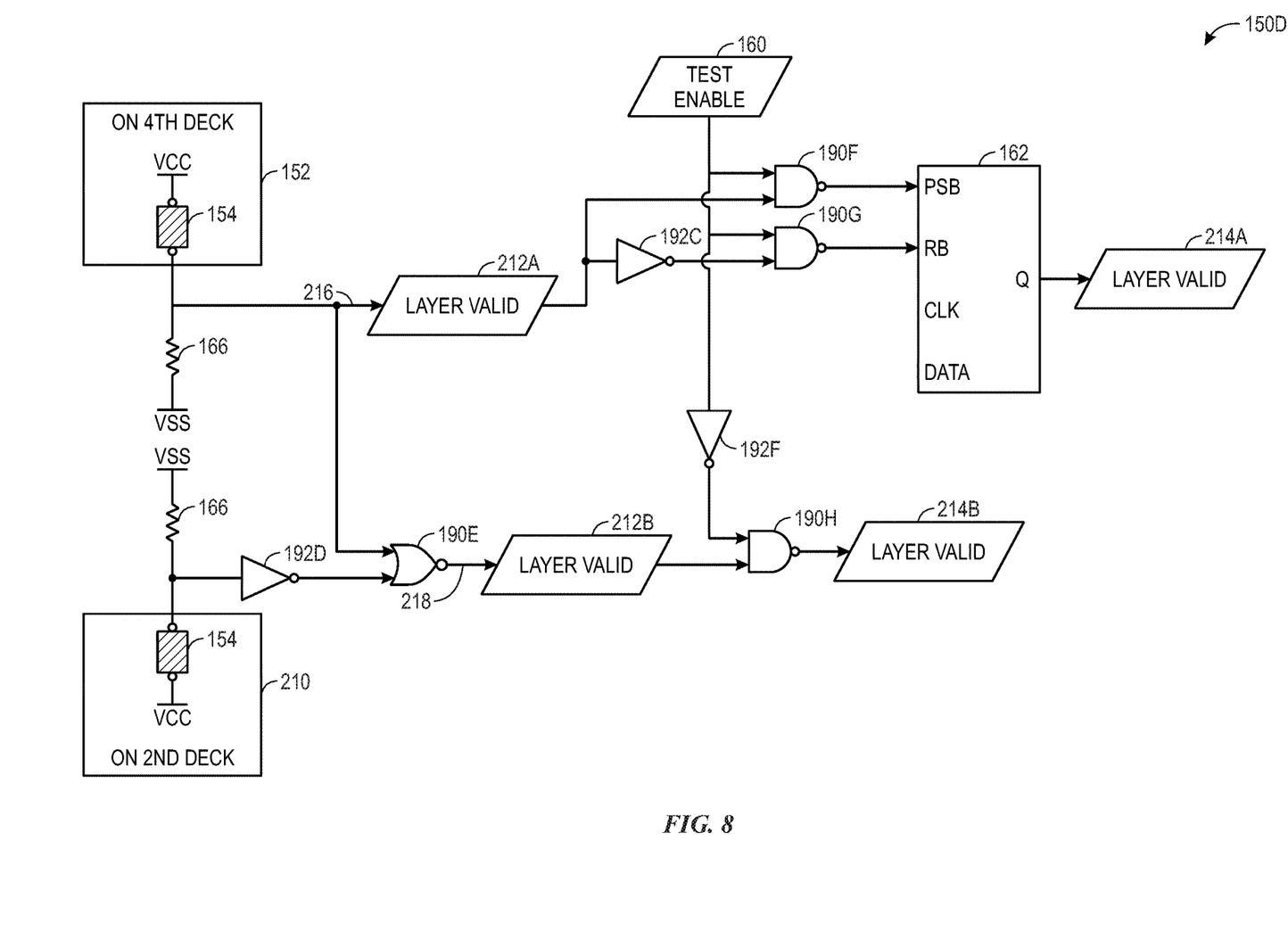
FIG. 8 is a circuit diagram of a fourth detection circuit used to detect a deck of the memory array of FIG. 2, according to an embodiment of the present disclosure.

In yet another example, FIG. 8 is a circuit diagram of a detection circuit 150D used to detect the deck 152 and additional deck 210. Both the deck 152 and the deck 210 include respective ones of the conductive identifier 154 coupled between respective ones of the switch 156 and the system high voltage supply, VCC. The deck 152 may correspond to a fourth deck while the deck 210 may correspond to a second deck. The detection circuit 150D may be disposed within the control circuit 122, another suitable controller, outside of the deck 152 (as depicted), on the deck 152, or any combination thereof. The control circuit 122 may identify that the memory array 130 includes one deck, two decks, or four decks based on which, if any, of Layer Valid signals 212 (212A, 212B), or in some embodiments, which, if any, of Layer Valid signals 214 (214A, 214B) are detected. It is noted that in some cases, three decks may not be used in the memory array 130, such as due to binary arithmetic guidelines, thus the control circuit 122 may not test specifically for a presence of three decks.

For example, when the control circuit 122 detects the Layer Valid signal 212A and/or the Layer Valid signal 214A, the control circuit 122 may determine that the memory array 130 includes four decks. However, when the control circuit 122 detects the Layer Valid signal 212B and/or the Layer Valid signal 214B, the control circuit 122 may determine that the memory array 130 includes two decks. When the control circuit 122 detects none of the Layer Valid signals 212 and/or the Layer Valid signals 214, the control circuit 122 may determine that the memory array 130 includes one deck. The control circuit 122 may use inference-based determinations with the detection circuit 150D to determine the number of layers by interpreting a lack of Layer Valid signals 212 and 214 as meaning a particular number of layers.

To elaborate on operation, in some cases, the control circuit 122 directly receives the Layer Valid signals 212 from a path 216 and/or from a path 218. A logic gate 190F may output a logic high signal when the deck 210 includes the conductive identifier 154 without the deck 152 including the conductive identifier 154 (e.g., when the logic gate 190E receives a logic low signal from inverter 192D and receives a logic low signal from the path 216). As described, when the deck 152 includes the conductive identifier 154, the path 216 may transmit a logic high signal as the Layer Valid signal 212A.

In some cases, the detection circuit 150D may include logic gates 190F, 190G, and 190H to further control output of the Layer Valid signals 212 to the control circuit 122 (e.g., as Layer Valid signals 214). The control circuit 122 may transmit a logic low signal as the Test Enable signal 160 to permit the logic gates 190F, 190G, and 190H to selectively output at most one of the Layer Valid signals 214 to the control circuit 122.

Figure 9:
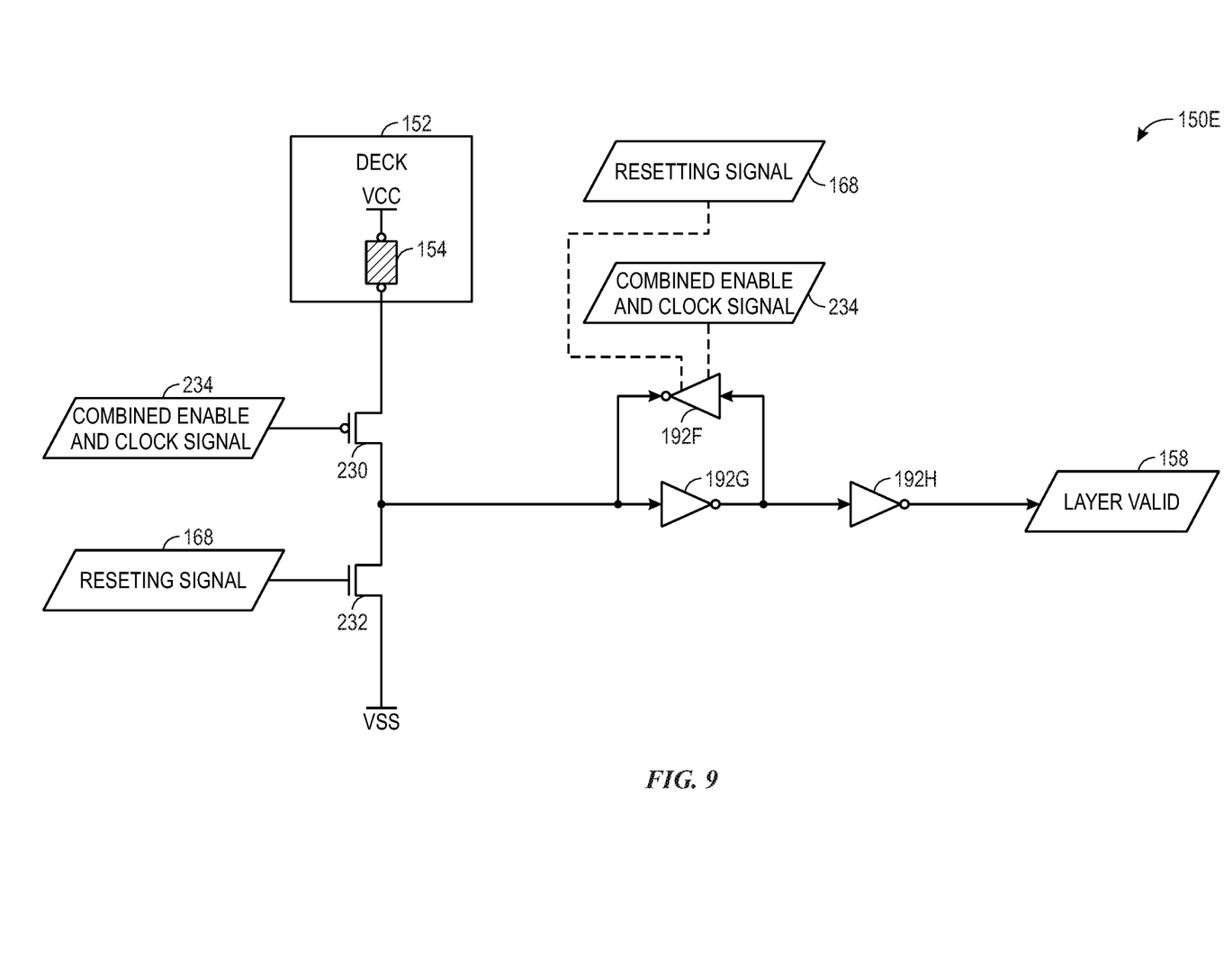
FIG. 9 is a circuit diagram of a fifth detection circuit used to detect a deck of the memory array of FIG. 2, according to an embodiment of the present disclosure.

In each example so far, the detection circuit 150 has included latching circuitry (e.g., flip-flop 162). However, in some cases, the control circuit 122 may use other circuitry to generate the Layer Valid signal 158, such as cross-coupled inverters. For example, FIG. 9 is a circuit diagram of a detection circuit 150E used to detect the deck 152. The deck 152 includes the conductive identifier 154 coupled between a switch 230 and the system high voltage supply, VCC. The switch 230 may couple to a switch 232 that is coupled to the system low voltage supply, VSS. The detection circuit 150E may be disposed within the control circuit 122, another suitable controller, outside of the deck 152 (as depicted), on the deck 152, or any combination thereof. The control circuit 122 may identify that the deck 152 exists by reading the Layer Valid signal 158.

To elaborate, the control circuit 122 may receive the Layer Valid signal 158 from inverter 192H. In some cases, the inverter 192H may transmit the Layer Valid signal 158 into a register and/or data store for the control circuit 122 to access. The control circuit 122 may transmit the Resetting signal 168 suitable to cause the switch 232 to activate. At activation, a logic low signal is stored by cross-coupled inverters 192F and 192G, such that the cross-coupled inverters 192F and 192G continually input and output to each other the logic low signal.

When the control circuit 122 is ready to detect the existence of the deck 152, the control circuit 122 may transmit a Combined Enable and Clock signal 234, as an inverse value of the Resetting signal 168. The Combined Enable and Clock signal 234 may activate and permit transmission of a logic high signal to the cross-coupled inverters 192F and 192G to override storage of the logic low signal. The Clocking signal 164 and/or the Test Enable Signal 160 may be functionally provided by the Combined Enable and Clock signal 234. The Combined Enable and Clock signal 234 and the switch 230 may be of suitable strength to overcome feedback of the cross-coupled inverters 192F and 192G. In some cases, a voltage value of the Combined Enable and Clock signal 234 and/or the Test Enable signal 160 may be used to control the feedback of the cross-coupled inverters 192F and 192G (e.g., a gain affecting a respective output from inverter 192F and/or inverter 192G). When the cross-coupled inverters 192F and 192G store the logic high output from the deck 152, the Layer Valid signal 158 may change state to indicate the existence of the deck 152 to the control circuit 122. Furthermore, once the cross-coupled inverters 192F and 192G store the logic high output from the deck 152, the Combined Enable and Clock signal 234 may be disabled to stop the detection circuit 150E from consuming additional power (e.g., since the cross-coupled inverters 192F and 192G hold the detection result in memory).

Figure 10:
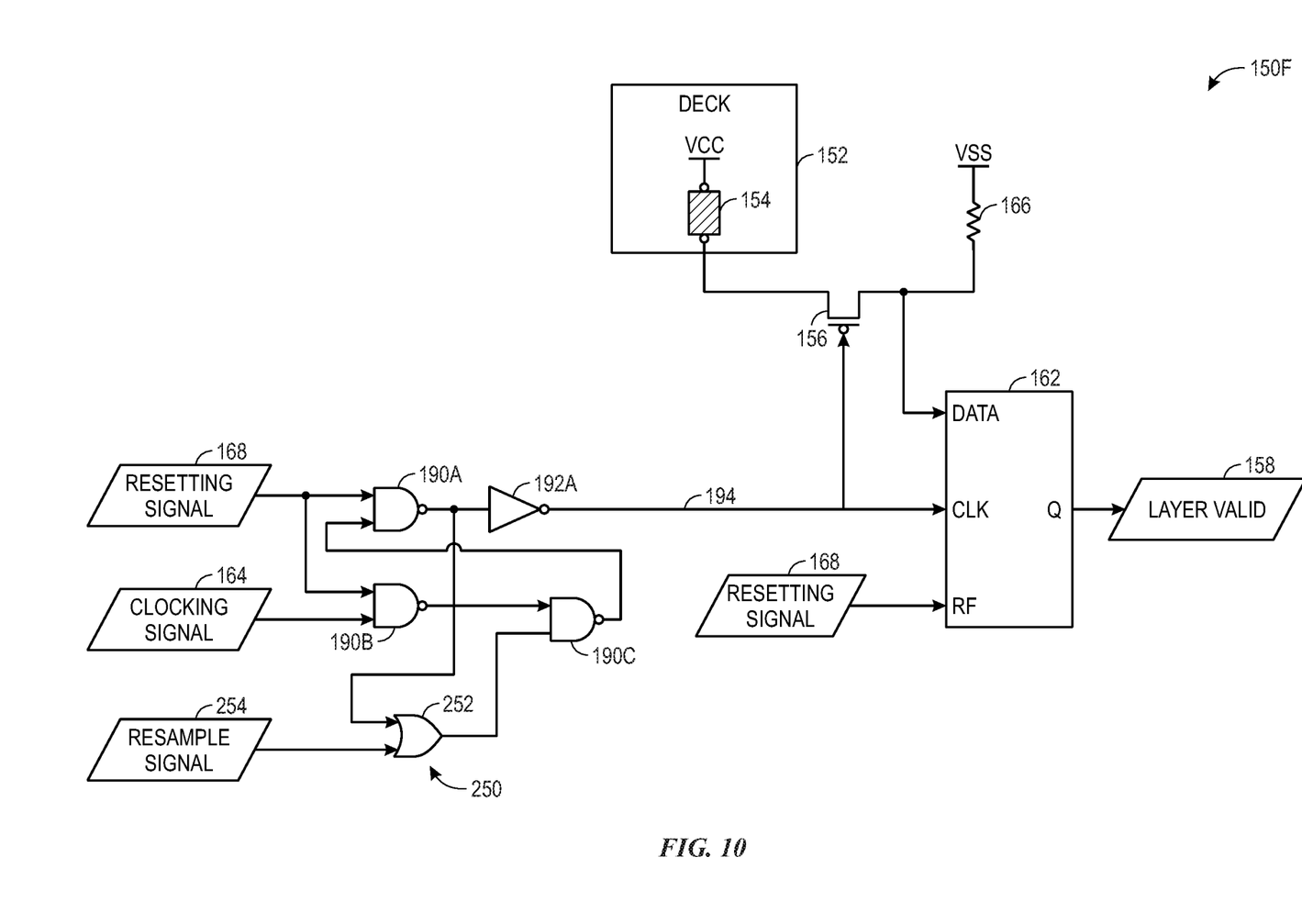
FIG. 10 is a circuit diagram of a sixth detection circuit used to detect a deck of the memory array of FIG. 2, according to an embodiment of the present disclosure.

In some cases, additional circuitry may be added to the detection circuit 150B. FIG. 10 is a circuit diagram of a detection circuit 150F used to detect the deck 152 with additional circuitry 250 added to the detection circuit 150B. The additional circuitry 250 includes a logic gate 252 (e.g., OR gate) that receives an input from logic gate 190A and a Resample signal 254. The detection circuit 150F may operate to prevent multiple re-samplings of the conductive identifier 154 by blocking a path to the CLK input of the flip-flop 162 (e.g., storage element represented by flip-flop 162). This may be desired when transmission of the Clocking signal 164 may be repeated during operation of the memory 100. Assertion/de-assertion of the Resample signal 254 may make it possible to reset, re-enable, and re-measure the conduction path of the conductive identifier 154. This may increase flexibility of usage of the detection circuit 150F, and may permit the memory 100 to be retested after an initial use of the detection circuit 150F.

Technical effects of the present disclosure include systems and methods that permit a control circuit to determine a number of decks included within a corresponding memory array based on a number of Layer Valid signals detected. This may replace methods associated with reading a one-time written fuse, burned in during manufacturing and subject to operator-based or interpretation-based errors. Many detection circuits are described herein that include variations to signals used for clocking, signals used to generate the Layer Valid signals, and so on. Furthermore, in some cases, some detection circuits may use latching circuitry while some detection circuits may transmit the Layer Valid signals directly to circuitry that interpret the Layer Valid signals, such as the control circuit. It is noted that some of the described detection circuit examples may use relatively fewer components, and thus may be relatively less expensive (e.g., smaller in footprint, less costly to manufacture), than other detection circuit examples with relatively more components. Additionally or alternatively, a detection circuit that receives relatively fewer input signals to generate the Layer Valid signal may be considered an improvement to a detection circuit that receives relatively more input signals. For example, the detection circuitry of FIG. 6 may operate in response to two input signals (e.g., Test Enable and resetting signals) while the detection circuitry of FIG. 4 may operate in response to three input signals (e.g., Test Enable, clocking, and resetting signals), and thus may be considered an improvement and/or a more efficient design of a detection circuit.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
    detection circuitry comprising latching circuitry; and
    a deck of a memory array, wherein the deck comprises a conductive identifier configured to couple a logic high voltage node to the latching circuitry; and
    a control circuit coupled to the detection circuit, wherein the control circuit is configured to perform operations comprising:
        transmitting a test enable signal to the detection circuitry, wherein the detection circuitry is configured to generate a valid signal in response to the test enable signal causing the conductive identifier to couple the logic high voltage node to the latching circuitry;
        receiving the valid signal from the detection circuitry; and
        adjusting a memory operation associated with the memory array based at least in part on the valid signal.

2. The device of claim 1, wherein the control circuit is configured to adjust the memory operation based at least in part on a number of decks of the memory array, wherein the control circuit receiving the valid signal from the detection circuitry comprises the control circuit receiving a plurality of valid signals, and wherein the control circuit is configured to use the plurality of valid signals to determine the number of decks of the memory array.

3. The device of claim 1, wherein the deck comprises a plurality of memory cells disposed in a same plane, wherein a subset of the plurality of memory cells share at least one wordline and at least one bitline.

4. The device of claim 1, wherein the control circuit is configured to generate the test enable signal in response to a powering-on of at least the detection circuitry.

5. The device of claim 1, wherein the detection circuitry comprises a plurality of inverters, wherein a pair of inverters of the plurality of inverters is configured to store an output from the deck generated by the coupling of the logic high voltage node to the detection circuitry, and wherein a first inverter of the plurality of inverters generates the valid signal from the output from the deck.

6. The device of claim 1, wherein the detection circuitry comprises logic gates that toggle an output in response to a combination of the test enable signal and a reset signal, wherein the operations comprise generating the reset signal in response to the control circuit determining to reset a state held by the latching circuitry.

7. The device of claim 1, wherein the detection circuitry comprises a feedback path coupling an output of the latching circuitry to an input of the latching circuitry, wherein the feedback path comprises a first logic gate and an inverting logic gate, wherein a first output signal from the first logic gate is an inverse of a value of a second output signal from the latching circuitry.

8. The device of claim 7, wherein the operations comprise disabling the test enable signal when the feedback path stores the value corresponding to the valid signal.

9. The device of claim 1, comprising a plurality of detection circuitry, wherein the memory array comprises a plurality of decks in addition to the deck, wherein each respective deck of the plurality of decks comprises respective conductive identifiers coupled between the logic high voltage node and respective detection circuitry of the plurality of detection circuitry.

10. A method, comprising:
    transmitting, by a control circuit, a test enable signal to detection circuitry, wherein a deck of a memory array is configured to couple a logic high voltage node to the detection circuitry through a conductive identifier, and wherein the detection circuitry is configured to generate a valid signal in response to the test enable signal causing the conductive identifier to couple the logic high voltage node to the detection circuitry;
    receiving, by the control circuit, the valid signal from the detection circuitry; and
    adjusting, by the control circuit, a memory operation associated with the memory array based at least in part on the valid signal.

11. The method of claim 10, wherein adjusting the memory operation comprises:
    determining, by the control circuit, a total number of decks of the memory array based at least in part on the valid signal; and
    adjusting, by the control circuit, the memory operation based at least in part on a number of decks of the memory array.

12. The method of claim 11, wherein adjusting the memory operation based at least in part on the number of decks of the memory array comprises adjusting a memory address defined as a maximum memory address of the memory array.

13. The method of claim 10, wherein receiving, by the control circuit, the valid signal from the detection circuitry comprises:
    transmitting, by the control circuit, a clocking signal to latching circuitry of the detection circuitry; and
    receiving, by the control circuit, the valid signal from the detection circuitry in response to the latching circuitry receiving the clocking signal.

14. The method of claim 10, comprising disabling, by the control circuit, the test enable signal after receiving the valid signal from the detection circuitry.

15. The method of claim 10, comprising:
    determining, by the control circuit, to reset an output from latching circuitry of the detection circuitry; and
    transmitting, by the control circuit, a reset signal and an additional test enable signal to the detection circuitry in response to determining to reset the output from the latching circuitry.

16. A device, comprising:
    detection circuitry configured to electrically couple to a conductive identifier configured to couple a voltage node to the detection circuitry, wherein the conductive identifier is associated with a deck of a memory array; and
    a control circuit coupled to the detection circuit, wherein the control circuit is configured to perform operations comprising:
        transmitting a test enable signal to the detection circuitry, wherein the detection circuitry is configured to generate a valid signal in response to the test enable signal causing the conductive identifier to couple the voltage node to the detection circuitry;
        receiving the valid signal from the detection circuitry; and
        adjusting a memory operation associated with the memory array based at least in part on the valid signal.

17. The device of claim 16, wherein the detection circuitry comprises a plurality of logic gates configured to operate in combination to generate the valid signal in response to the conductive identifier coupling the detection circuitry to the logic high voltage node.

18. The device of claim 17, and wherein the plurality of logic gates comprises an AND gate, an OR gate, a not-AND gate, a not-OR gate, an exclusive-OR gate, an inverting gate, or any combination thereof.

19. The device of claim 16, wherein the memory operation is associated with a write memory command, a read memory command, a refresh memory command, or any combination thereof.

20. The device of claim 16, wherein the control circuit is configured to receive the valid signal from the detection circuitry based at least in part on an output generated by cross-coupled inverters.

* * * * *